US010533893B2

(12) United States Patent
Leonardo

(10) Patent No.: US 10,533,893 B2
(45) Date of Patent: Jan. 14, 2020

(54) AVALANCHE DIODE ARRANGEMENT AND METHOD FOR PROVIDING A DETECTION SIGNAL

(71) Applicant: ams AG, Unterpremstaetten (AT)

(72) Inventor: Vincenzo Leonardo, Waedenswil (CH)

(73) Assignee: ams AG, Unterpremstaetten (AT)

( * ) Notice: Subject to any disclaimer, the term of this patent is extended or adjusted under 35 U.S.C. 154(b) by 155 days.

(21) Appl. No.: 15/566,204

(22) PCT Filed: Apr. 7, 2016

(86) PCT No.: PCT/EP2016/057565
§ 371 (c)(1),
(2) Date: Oct. 12, 2017

(87) PCT Pub. No.: WO2016/166002
PCT Pub. Date: Oct. 20, 2016

(65) Prior Publication Data
US 2018/0120152 A1 May 3, 2018

(30) Foreign Application Priority Data

Apr. 15, 2015 (EP) ..................... 15163692

(51) Int. Cl.
G01J 1/44 (2006.01)
G01J 1/42 (2006.01)
(Continued)

(52) U.S. Cl.
CPC ........ G01J 1/4228 (2013.01); H01L 27/1446 (2013.01); H01L 31/02027 (2013.01);
(Continued)

(58) Field of Classification Search
CPC ........ G01J 2001/4466; G01J 2001/442; G01T 1/248
See application file for complete search history.

(56) References Cited

U.S. PATENT DOCUMENTS 3,560,755 A 2/1971 Blaise et al.
2002/0195545 A1 12/2002 Nishimura et al.
(Continued)

FOREIGN PATENT DOCUMENTS

EP 0094972 A1 11/1983
JP S-55162278 A 12/1980
(Continued)

OTHER PUBLICATIONS

Lin, F. et al: "A photon-counting avalanche photodiode array with fully integrated active quenching and recharging circuit" Proceedings of SPIE vol. 5826, Jun. 3, 2005 (Jun. 3, 2005), pp. 569-579, XP55222873, ISSN: 0277-786X, DOI: 10.1117/12.604846 ISBN: 978-1-62841-839-2.
(Continued)

Primary Examiner — Thanh Luu
(74) Attorney, Agent, or Firm — Fish & Richardson P.C.

(57) ABSTRACT

An avalanche diode arrangement (10) comprises an avalanche diode (11) that is coupled to a first voltage terminal (16) and to a first node (13), an event detector (14) for detecting a trigger event of the avalanche diode (11) and being coupled to the first node (13), a quenching circuit (15) that is coupled to the first node (13), and a detection circuit (20) coupled to the first node (13). The detection circuit (20) is configured to provide a detection signal (SVC2) that depends on a value of a node voltage (SVA) at the first node (13).

12 Claims, 7 Drawing Sheets

(51) Int. Cl.
*H01L 31/02* (2006.01)
*H01L 31/107* (2006.01)
*H01L 27/144* (2006.01)
*H01L 31/12* (2006.01)

(52) U.S. Cl.
CPC .......... *H01L 31/107* (2013.01); *H01L 31/125* (2013.01); *G01J 2001/442* (2013.01); *G01J 2001/448* (2013.01); *G01J 2001/4466* (2013.01)

(56) References Cited

U.S. PATENT DOCUMENTS

| | | | |
|---|---|---|---|
| 2007/0075215 A1 | 4/2007 | Giovannini et al. | |
| 2009/0236502 A1 | 9/2009 | Ishii | |
| 2010/0296540 A1* | 11/2010 | Pan | H01L 27/15 372/45.012 |
| 2012/0075615 A1* | 3/2012 | Niclass | G01S 7/4814 356/5.01 |
| 2013/0334411 A1 | 12/2013 | Brunel et al. | |
| 2014/0191115 A1 | 7/2014 | Webster et al. | |

FOREIGN PATENT DOCUMENTS

| | | |
|---|---|---|
| WO | 2010100574 A2 | 9/2010 |
| WO | 2011127343 A2 | 10/2011 |
| WO | WO 2016/003451 A1 | 1/2016 |

OTHER PUBLICATIONS

Rochas, A. et al.: "ASIC for high speed gating and free running operation of SPADs" SPIE, PO Box 10 Bellingham WA 98277-0010 USA, vol. 6583, No. 65830F-1, Dec. 31, 2007 (Dec. 31, 2007), XP040240857.

Rochas, A. et al.: "Single photon detector fabricated in a complementary metal-oxide-semiconductor high-voltage technology" Review of Scientific Instruments, AIP, Melville, NY, US, vol. 74. No. 7, Jul. 1, 2003 (Jul. 1, 2003), pp. 3263-3270, XP012040912, ISSN: 0034-6748, DOI: 10.1063/1.1584083.

Bronzi, D. et al.: "Fast Sensing and Quenching of CMOS SPADs for Minimal Afterpulsing Effects" IEEE Photonics Technology Letters, vol. 25, No. 8, Apr. 15, 2013.

Charbon, E.: "CMOS integration enables massively parallel single-photon detection" Mar. 9, 2011 SPIE Newsroom (website: http://spie.org/x44509.xml) DOI: 10.1117/2.1201102.003182.

Subash Sachidananda et al.: "Bias voltage Control of Avalanche Photo-Diode Using a Window Comparator" retrieved from http://arxiv.org/pdf/1111.2656v1.pdf; published Nov. 11, 2011.

Shingo Mandai et al.: "Stabilizing sensitivity in large single-photon image sensors with an integrated 3.3-to-25V all-digital charge pump" 2013 International Image Sensor Workshop, Utah, USA; Jun. 12-16, 2013.

Office Action issued in EP Application No. 15163692.5, dated Dec. 5, 2019, 6 pages.

* cited by examiner

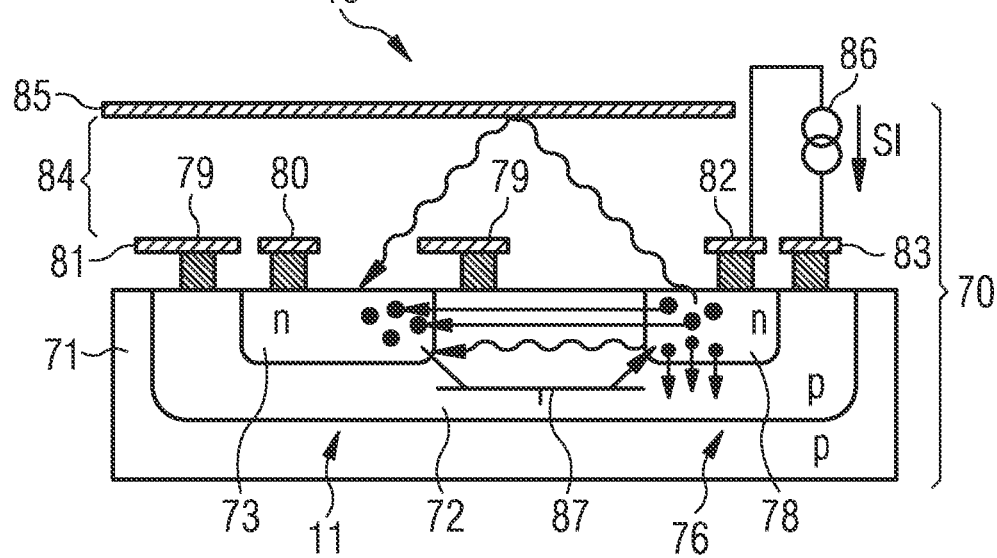

AVALANCHE DIODE ARRANGEMENT AND METHOD FOR PROVIDING A DETECTION SIGNAL

BACKGROUND

The present application is related to an avalanche diode arrangement and a method for providing a detection signal.

An avalanche diode is a diode that is designed to obtain avalanche breakdown at a reverse bias voltage. An avalanche diode can be used as a single photon avalanche diode or detector, abbreviated as SPAD. A single photon is able to trigger the avalanche breakdown. This mode of operation is named Geiger mode.

A SPAD device has to be operated with a bias voltage several volts above the breakdown voltage of the avalanche diode. Thus, the bias voltage is the sum of the breakdown voltage and of an excess bias voltage. Keeping the excess bias voltage constant ensures that the sensitivity of the SPAD device remains constant as well. The breakdown voltage may vary according to manufacturing conditions and temperature. If a constant bias voltage is applied, the variation of the breakdown voltage would result in a change of the excess bias voltage causing a loss of sensitivity, the damaging of circuits of the avalanche diode arrangement, an increased dark count rate, abbreviated as DCR, or after pulsing probability.

SUMMARY

In an embodiment, an avalanche diode arrangement comprises an avalanche diode, an event detector, a quenching circuit and a detection circuit. The avalanche diode is coupled to a first voltage terminal and to a first node. The event detector is configured for detecting a trigger event of the avalanche diode. The event detector is coupled to the first node. The quenching circuit is also coupled to the first node. The detection circuit is additionally coupled to the first node. The detection circuit is configured to provide a detection signal that depends on a value of a node voltage at the first node of the avalanche diode.

Advantageously, the value of the node voltage during quenching directly corresponds to an excess bias voltage. Thus, the excess bias voltage can be monitored by means of the detection signal. The avalanche diode arrangement controls a value of a bias voltage at the first voltage terminal depending on the detection signal. The bias voltage is changed such that the excess bias voltage is kept constant at a predetermined value or within a predetermined interval. The avalanche diode arrangement keeps the value of the node voltage during subsequent trigger events at the predetermined value or within the predetermined interval.

The avalanche diode may be realized as a single photon avalanche diode, abbreviated SPAD.

A control terminal of the quenching circuit may be coupled to an output of the event detector.

In an embodiment, the detection signal is generated by the detection circuit as a function of the value of the node voltage at the first node with respect to a voltage at a second voltage terminal such as, for example, a reference potential terminal.

A first terminal of the avalanche diode may be coupled to the first node. A second terminal of the avalanche diode may be coupled to the first voltage terminal. The avalanche diode is oriented in the avalanche diode arrangement such that it is non-conducting with the exception of trigger events.

The first terminal of the avalanche diode may be realized as anode and the second terminal of the avalanche diode may be realized as cathode.

In an embodiment, the quenching circuit comprises a quenching transistor. A first terminal of the quenching transistor is coupled to the first node. A second terminal of the quenching transistor is coupled to the second voltage terminal or a supply voltage terminal. A control terminal of the quenching transistor is coupled to the output of the event detector. The quenching circuit may be free of a coupling to the first voltage terminal.

In an alternative embodiment, the quenching circuit comprises a resistor. A first terminal of the resistor may be coupled to the first node. A second terminal of the resistor may be coupled to the second voltage terminal or to the supply voltage terminal.

A controlled section of the quenching transistor may obtain a high resistance during quenching. The controlled section of the quenching transistor may obtain a low conductivity in other durations beside the quenching duration.

In an embodiment, the event detector comprises a first input that is coupled to the first node.

In an embodiment, the event detector is implemented as a current sensing circuit. The event detector generates an event signal, if a current through the avalanche diode rises above an event reference threshold in the case of a trigger event.

In an embodiment, the event detector generates the event signal depending on a comparison of a signal at its first input with an event threshold. The signal at its first input may be the node voltage. The event threshold may be a predetermined current value.

In an embodiment, the event detector is implemented as one circuit of a group comprising a comparator, a Schmitt-trigger circuit and an amplifier such as an operation amplifier. The event detector comprises a second input to which the event threshold is provided. The event threshold may be a predetermined voltage value. The event threshold may be smaller than the reference voltage.

In an alternative embodiment, the event detector is implemented as one circuit of a group comprising a buffer and an inverter. A threshold voltage of the buffer or the inverter corresponds to the event threshold. The event threshold is incorporated in the circuit of the event detector itself.

In an embodiment, the avalanche diode arrangement comprises a monostable multivibrator that is coupled to the output of the event detector and to the control terminal of the quenching circuit. The term monostable multivibrator can be shortened into monostable.

In an embodiment, the detection circuit provides the detection signal as a function of the value of the node voltage during a quenching duration. The avalanche diode is quenched during the quenching duration. The quenching circuit provides the quenching of the avalanche diode during the quenching duration. The quenching duration may have a predetermined value. Thus, the detection signal represents the value of the node voltage shortly after the trigger event and during the quenching duration.

In an embodiment, the detection circuit comprises a comparator or Schmitt-trigger circuit. The first input of the comparator or Schmitt-trigger circuit is coupled to the first node. A reference voltage is provided to a second input of the comparator or Schmitt-trigger circuit. The detection signal has a first logical value, if the node voltage is less than the reference voltage, and a second logical value, if the node voltage is higher than the reference voltage.

In a further development, the avalanche diode arrangement comprises a digital-to-analog converter, abbreviated DAC. An output of the DAC is coupled to the second input of the comparator or Schmitt-trigger circuit of the detection circuit. Thus, the reference voltage is generated by the DAC. The node voltage is approximately constant within subsequent trigger events. Thus, by setting the reference voltage to different predetermined values, an interval can be determined in which the node voltage resides. For example, the detection circuit may use a successive-approximation-register principle to obtain the detection signal representing the value of the node voltage with high accuracy. The DAC and the detection circuit may be part of a loop. The loop may be formed by the DAC, the detection circuit and a control unit.

In an embodiment, the value of the node voltage at the first node between the avalanche diode and the quenching circuit does not change very much from one trigger event of the avalanche diode to the next trigger event. Thus, small changes of the reference voltage provided to the comparator or the Schmitt-trigger circuit are sufficient to detect a change of the value of the node voltage. The time needed for providing a result by the comparator or the Schmitt-trigger circuit may be shorter than a conversion time needed by an analog-to-digital converter. Only the least significant bit or bits of the value of the node voltage may be determined.

In an embodiment, the detection circuit is implemented as an analog-to-digital converter, abbreviated ADC. The detection signal generated by the ADC is the digitized value of the node voltage. Thus, the detection circuit may determine the value of the node voltage with high accuracy. The ADC may be realized as a flash converter. Typically, the analog-to-digital converter may provide a complete conversion of the value of the node voltage into a digital signal.

In an embodiment, the avalanche diode arrangement comprises a filter having inputs coupled to the output of the event detector and to the output of the detection circuit. Advantageously, a signal that signifies the avalanche diode activity and a further signal that depends on the value or height of the node voltage are both provided to the filter. The filter generates a ratio signal for controlling a bias voltage generator. Two inputs of the filter may be directly connected to the output of the event detector and to the output of the detection circuit. The ratio signal is a function of the event signal and the detection signal or of the event signal, the detection signal and the further detection signal.

In an embodiment, an avalanche diode arrangement comprises a semiconductor body. The semiconductor body comprises an avalanche diode and a diode. The avalanche diode and the diode are located in the semiconductor body such that the diode can trigger the avalanche diode. The avalanche diode and the diode are arranged in close vicinity to each other. Such an avalanche diode arrangement may be realized with or without an event detector and/or a quenching circuit and/or a detection circuit and/or other circuit parts.

In an embodiment, the diode injects carriers into the avalanche diode that trigger the avalanche diode. Thus, carriers generated by the diode flow into a space charge region of the avalanche diode and trigger the avalanche effect of the avalanche diode.

In an embodiment, the diode emits photons that are absorbed by the avalanche diode and trigger the avalanche diode. The diode may emit photons using electroluminescence. The emitted photons are absorbed in the space charge region of the avalanche diode, thus causing the avalanche effect.

Advantageously, the diode is configured to emit photons that are absorbed by the avalanche diode for triggering the avalanche diode. Both the avalanche diode and the diode are located in the common semiconductor body. They may be both arranged in one substrate of the semiconductor body.

In an embodiment, the avalanche diode arrangement comprises a control circuit. The control circuit generates a signal for the diode. Thus, the control circuit is configured to cause a trigger event of the avalanche diode by providing an appropriate signal to the diode. The signal provided to the diode may be a current signal.

In an embodiment, a method for providing a detection signal comprises generating an event signal by an event detector that detects a trigger event of an avalanche diode. Moreover, the avalanche diode is quenched by a quenching circuit that is coupled via a first node to the avalanche diode and is controlled by the event signal. A detection signal is provided by a detection circuit that depends on a value of a voltage at the first node.

Since the value of the node voltage during quenching corresponds to the excess bias voltage, the excess bias voltage can easily be compared with a predetermined value and a bias voltage adjusted accordingly. Thus, a value of the bias voltage at a first voltage terminal is controlled by the detection signal. The operation of the avalanche diode is stabilized by regulating the bias voltage. The bias voltage can also be named supply voltage.

BRIEF DESCRIPTION OF THE DRAWINGS

The following description of figures may further illustrate and explain exemplary embodiments. Insofar as components, circuits and method steps correspond to one another in terms of their function in different figures, the description thereof is not repeated for each of the following figures.

FIGS. 4A to 4D show exemplary embodiments of a semiconductor body comprising an avalanche diode arrangement.

DETAILED DESCRIPTION

Figure 1B:
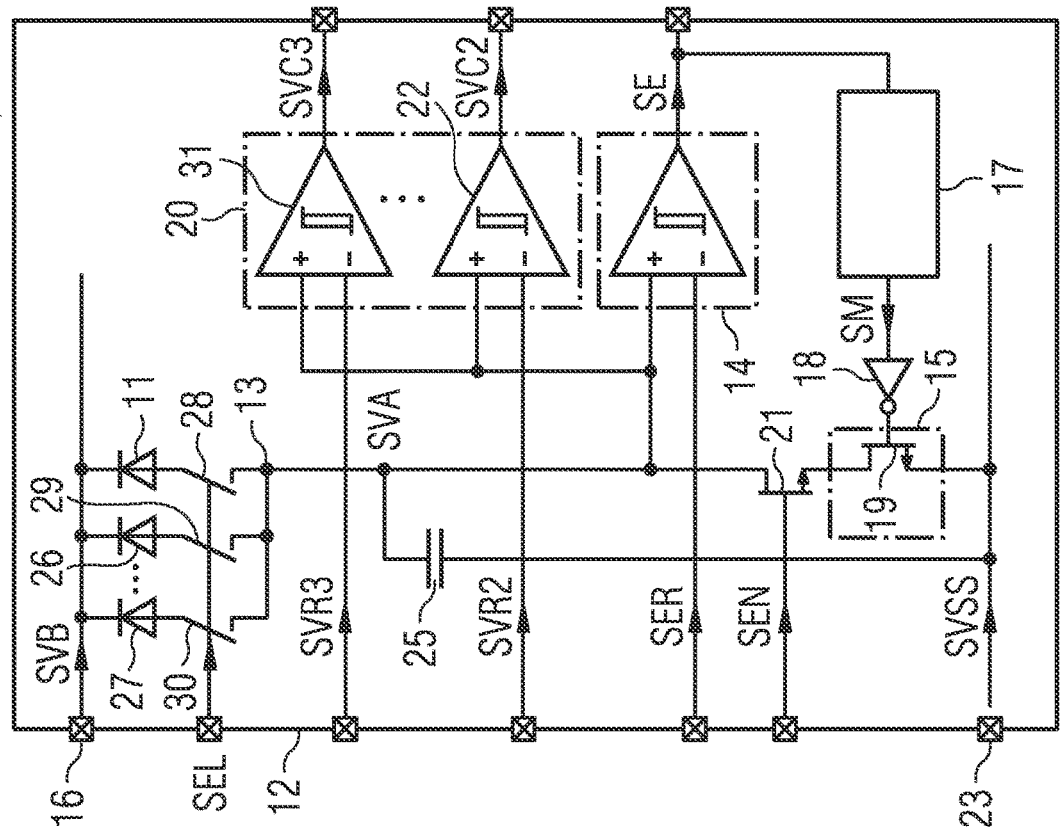
FIGS. 1A to 1E show exemplary embodiments of an avalanche diode arrangement.
Figure 1A:
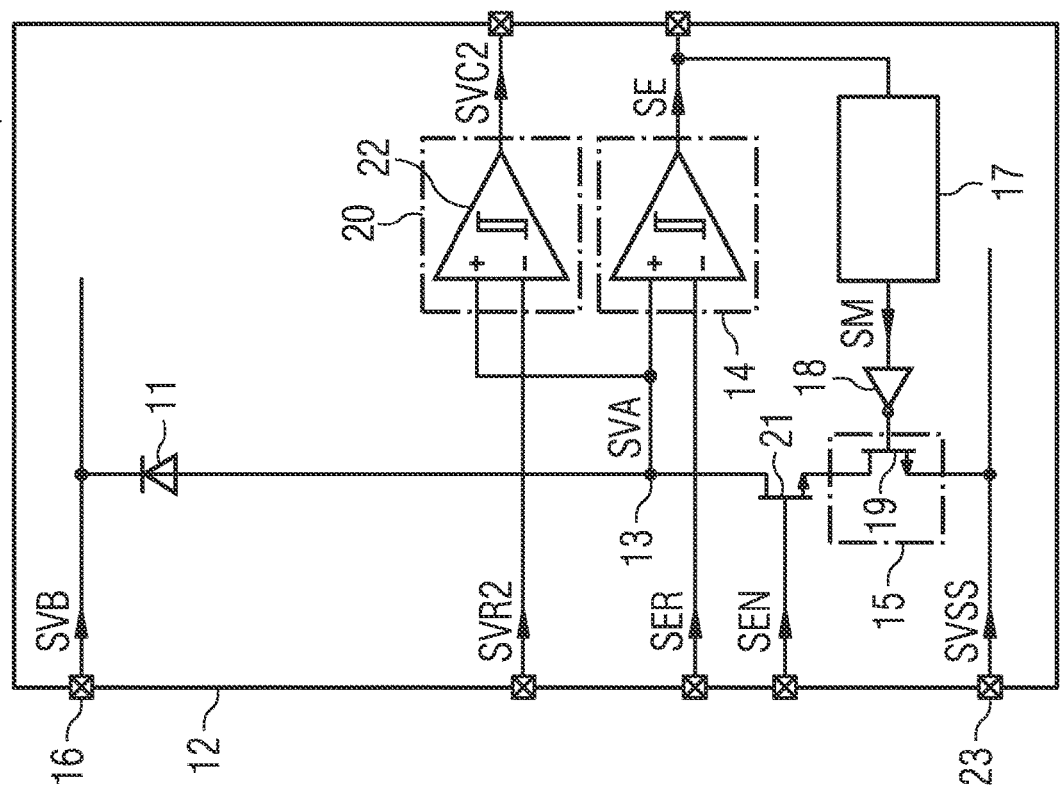

FIG. 1A shows an exemplary embodiment of an avalanche diode arrangement 10. The avalanche diode arrangement 10 comprises an avalanche diode 11 having a first and a second terminal. The second terminal of the avalanche diode 11 is connected to a first voltage terminal 16. The first voltage terminal 16 is connected to a bias voltage generator, not shown. The first terminal of the avalanche diode 11 is connected to a first node 13. An event detector 14 of the avalanche diode arrangement 10 has a first input connected to the first node 13. A second input of the event detector 14 is connected to an output of a reference generator or a DAC, not shown. The event detector 14 is implemented as a Schmitt-trigger circuit. Alternatively, the event detector 14 may be realized as a comparator, an operational amplifier, a buffer or an inverter.

Moreover, the avalanche diode arrangement 10 comprises a quenching circuit 15 that is coupled on a side to the first node 13. On another side the quenching circuit 15 is coupled to a second voltage terminal 23. The second voltage terminal 23 may be realized as a reference potential terminal. The output of the event detector 14 is coupled to a control terminal of the quenching circuit 15. A monostable multivibrator 17 of the avalanche diode arrangement 10 is coupled on the input side to an output of the event detector 14 and on the output side to a control terminal of the quenching circuit 15. An inverter 18 is arranged between the output of the monostable multivibrator 17 and the control terminal of the quenching circuit 15.

The quenching circuit 15 is realized as a quenching transistor 19. A first terminal of the quenching transistor 19 is coupled to the first node 13. A second terminal of the quenching transistor 19 is coupled to the second voltage terminal 23. A control terminal of the quenching transistor 19 is coupled to the output of the monostable multivibrator 17 via the inverter 18. The quenching transistor 19 is implemented as a field-effect transistor. The quenching transistor 19 may be realized as an n-channel metal-oxide-semiconductor field-effect transistor.

Furthermore, the avalanche diode arrangement 10 comprises a detection circuit 20 having a first input coupled to the first node 13. A second input of the detection circuit 20 is connected to a further reference voltage generator or a DAC, not shown. Thus, the first input of the detection circuit 20 and the first input of the event detector 14 are both connected in parallel to the first node 13. The detection circuit 20 comprises a Schmitt-trigger circuit 22. Alternatively, the detection circuit 20 may comprise a comparator instead of the Schmitt-trigger circuit 22.

Moreover, the avalanche diode arrangement 10 comprises an enabling transistor 21. A series circuit of the avalanche diode 11, the enabling transistor 21 and the quenching circuit 15 is arranged between the first and the second voltage terminal 16, 23. The enabling transistor 21 is arranged between the quenching circuit 15 and the avalanche diode 11. A series circuit of the enabling transistor 21 and the quenching circuit 15 couples the first node 13 to the second voltage terminal 23. The enabling transistor 21 is implemented as a field-effect transistor. The enabling transistor 21 may be realized as an n-channel metal-oxide-semiconductor field-effect transistor. The enabling transistor 21 is connected to the first node 13 and the quenching circuit 15 is connected to the second voltage terminal 23.

A bias voltage SVB is provided at the first voltage terminal 16. A reference potential SVSS can be tapped at the second voltage terminal 23. At the first node 13, a node voltage SVA is tapped. An event threshold SER is provided to the second input of the event detector 14. The event threshold SER has the form of a voltage. A reference voltage SVR2 is provided to the second input of the detection circuit 20. The event detector 14 generates an event signal SE at its output. The event signal SE is provided to the monostable multivibrator 17. The monostable multivibrator 17 generates a control signal SM. The control signal SM is applied to the control terminal of the quenching circuit 15 via the inverter 18. An enabling signal SEN is applied to the control terminal of the enabling transistor 21. The detection circuit 20 generates a detection signal SVC2.

In an alternative, not shown embodiment, the enabling transistor 21 is connected to the second voltage terminal 23 and the quenching circuit 15 is connected to the first node 13.

In an alternative, not shown embodiment, the monostable multivibrator 17 is omitted. The control terminal of the quenching circuit 15 may be coupled to a static voltage potential. This may be the case, if the detection circuit 20 is fast enough.

In an alternative, not shown embodiment, the quenching transistor 19 is replaced by a resistor. The output of the event detector 14 is not coupled to the quenching circuit 15.

Alternatively, a constant voltage such as e.g. the reference potential SVSS is applied to the control terminal of the quenching transistor 19.

Alternatively, the inverter 18 may be omitted and replaced by a connection line.

FIG. 1B shows a further exemplary embodiment of the avalanche diode arrangement 10 which is a further development of the embodiment shown in FIG. 1A. The avalanche diode arrangement 10 comprises a load capacitor 25 coupling the first node 13 to the second voltage terminal 23. The avalanche diode arrangement 10 obtains more than one avalanche diode 11, 26, 27. The avalanche diode arrangement 10 comprises at least a second avalanche diode 26, 27 that is arranged in parallel to the avalanche diode 11. A first diode switch 28 is arranged in series to the avalanche diode 11. A series circuit of the avalanche diode 11 and the first diode switch 28 is arranged between the first voltage terminal 16 and the first node 13. A second and a third diode switch 29, 30 are connected in series to the second and the third avalanche diode 26, 27. A series circuit of the second diode switch 29 and of the second avalanche diode 26 couples the first voltage terminal 16 to the first node 13. Similarly, a series circuit of the third diode switch 30 and the third avalanche diode 27 is arranged between the first voltage terminal 16 and the first node 13.

Additionally, the detection circuit 20 comprises a further Schmitt-trigger circuit 31 that is arranged in parallel to the Schmitt-trigger circuit 22. Alternatively, the detection circuit 20 may comprise a further comparator that is arranged in parallel to the comparator. A first input of the further Schmitt-trigger circuit 31 is connected to the first node 13. A second terminal of the Schmitt-trigger circuit 31 is connected to a further reference generator or DAC, not shown.

Thus, a further reference voltage SVR3 is provided to the second terminal of the further Schmitt-trigger circuit 31. A switch control signal SEL is provided to the control terminals of the first to third diode switch 28-30.

The avalanche diode arrangement 10 shown in FIGS. 1A and 1B can be designed as a reference pixel 12. The reference pixel 12 at least comprises the avalanche diode 11, the detection circuit 20, the event detector 14 and the quenching circuit 15. The reference pixel 12 may additionally comprise the enabling transistor 21, the monostable multivibrator 17 and the inverter 18. Moreover, the reference pixel 12 may further comprise the first to third diode switch 28-30 as well as the second and the third avalanche diode 26, 27.

As in the circuit of the reference pixel 12 shown in FIG. 1B, the reference pixel 12 comprises one or more avalanche diodes 11, 26, 27, the quenching transistor 19 and at least two comparators 14, 22, one for the detection of a trigger event and the other for the detection of the excess bias voltage SVE being above or below a defined threshold. The threshold may be equal to the reference voltage SVR2. The comparator 14 for detecting the trigger event controls the monostable multivibrator 17 for the dead time generation. In the circuit shown in FIG. 1B, needed and optional blocks are depicted.

In an alternative, not shown embodiment, the avalanche diode arrangement 10, respectively the reference pixel 12, comprises two or more than three avalanche diodes and corresponding diode switches.

Figure 1C:
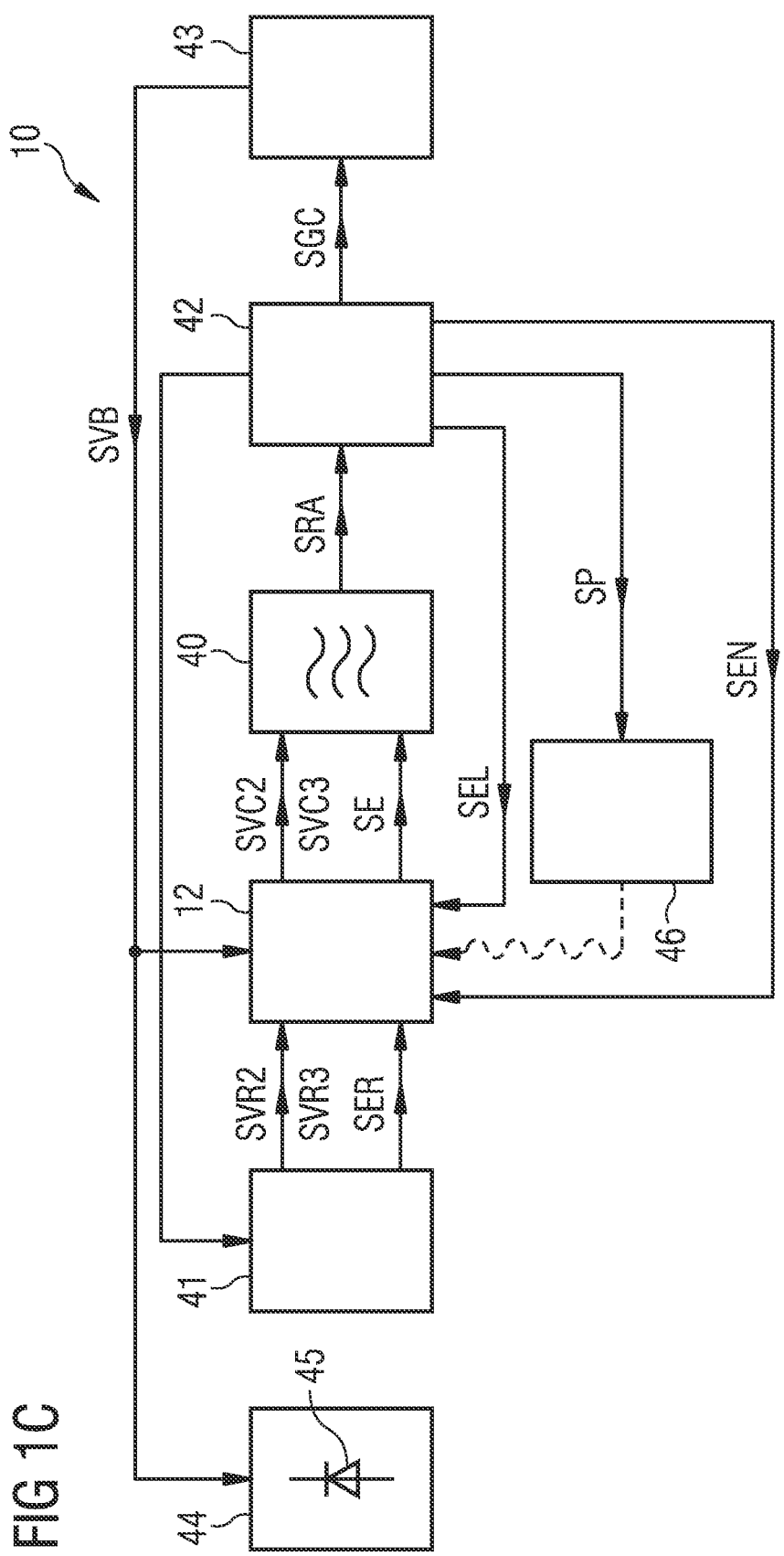

FIG. 1C shows a further exemplary embodiment of the avalanche diode arrangement 10 which is a further development of the embodiments shown in FIGS. 1A and 1B. The avalanche diode arrangement 10 comprises the reference pixel 12 as described above. Furthermore, the avalanche diode arrangement 10 comprises a filter 40 that is coupled on its input side to the reference pixel 12. The filter 40 may be realized as a digital filter. Inputs of the filter 40 are coupled to the output of the event detector 14 and to the output side of the detection circuit 20.

Moreover, the avalanche diode arrangement 10 comprises a digital-to-analog converter 41 abbreviated DAC that is coupled on its output side to the input side of the reference pixel 12. A first output of the DAC 41 is coupled to the second input of the event detector 14. A second output of the DAC 41 is coupled to the second input of the detection circuit 20. The avalanche diode arrangement 10 comprises a control unit 42. The control unit 42 is coupled on its output side to the enabling transistor 21. Moreover, the control unit 42 is connected on its output side to the control terminal of the first, second and third diode switch 28-30. Additionally, the control unit 42 is coupled on its output side to an input of the DAC 41.

Moreover, the avalanche diode arrangement 10 comprises a bias voltage generator 43 that is connected on its output side to the first voltage terminal 16. An input of the bias voltage generator is connected to a further output of the control unit 42. The avalanche diode arrangement 10 may comprise an active pixel 44. The active pixel 44 comprises a further avalanche diode 45. The active pixel 44 is connected on its input to the first voltage terminal 16. Additionally, the avalanche diode arrangement 10 may comprise a photon emission unit 46. The photon emission unit 46 is connected on its input side to an output of the control unit 42.

The DAC 41 generates the event threshold SER that is provided to the second input of the event detector 14. Additionally, the DAC 41 generates the reference voltage SVR2 that is applied to the second input of the detection circuit 20 and, thus, to the second input of the Schmitt-trigger circuit 22. The DAC 41 may generate the further reference voltage SVR3 that is applied to the second input of the further Schmitt-trigger circuit 31.

The reference pixel 12 generates the event signal SE that is provided to the filter 40. Moreover, the reference pixel 12 provides the detection signal SVC2 that is applied to the filter 40. The reference pixel 12 may provide the further detection signal SVC3 that is applied to the filter 40. The filter 40 generates a ratio signal SRA using the event signal SE and the detection signal SVC2 or the detection signals SVC2, SVC3. The ratio signal SRA is provided to the control unit 42. The control unit 42 generates a generator control signal SGC and applies it to the bias voltage generator 43. The bias voltage generator 43 generates the bias voltage SVB. The bias voltage SVB is generated by the bias voltage generator 43 as a function of the generator control signal SGC. The bias voltage generator 43 may increase, decrease or keep constant the bias voltage SVB depending on the value of the bias control signal SGC. The bias voltage SVB is provided both to the reference pixel 12 and to the active pixel 44.

Additionally, the control unit 42 generates the enabling signal SEN that is provided to the enabling transistor 21 of the reference pixel 12. The control unit 42 may generate the switch control signal SEL. The control unit 42 may set a photon control signal SP that is provided to the photon emission unit 46. The photon emission unit 46 generates, depending on the photon control signal SP, a photon or photons that are emitted towards the reference pixel 12. The photon emission unit 46 may be realized by a diode 76 and a current source 86 as shown in FIGS. 4A to 4D.

The avalanche diode arrangement 10 forms a regulation loop. One semiconductor body may comprise the avalanche diode arrangement 10 with the exception of the bias voltage generator 43. Alternatively, the semiconductor body may also comprise the bias voltage generator 43 with the exception of an inductor or capacitors. Alternatively, the semiconductor body may also comprise the bias voltage generator 43 fully integrated as a charge pump circuit.

Figure 1D:
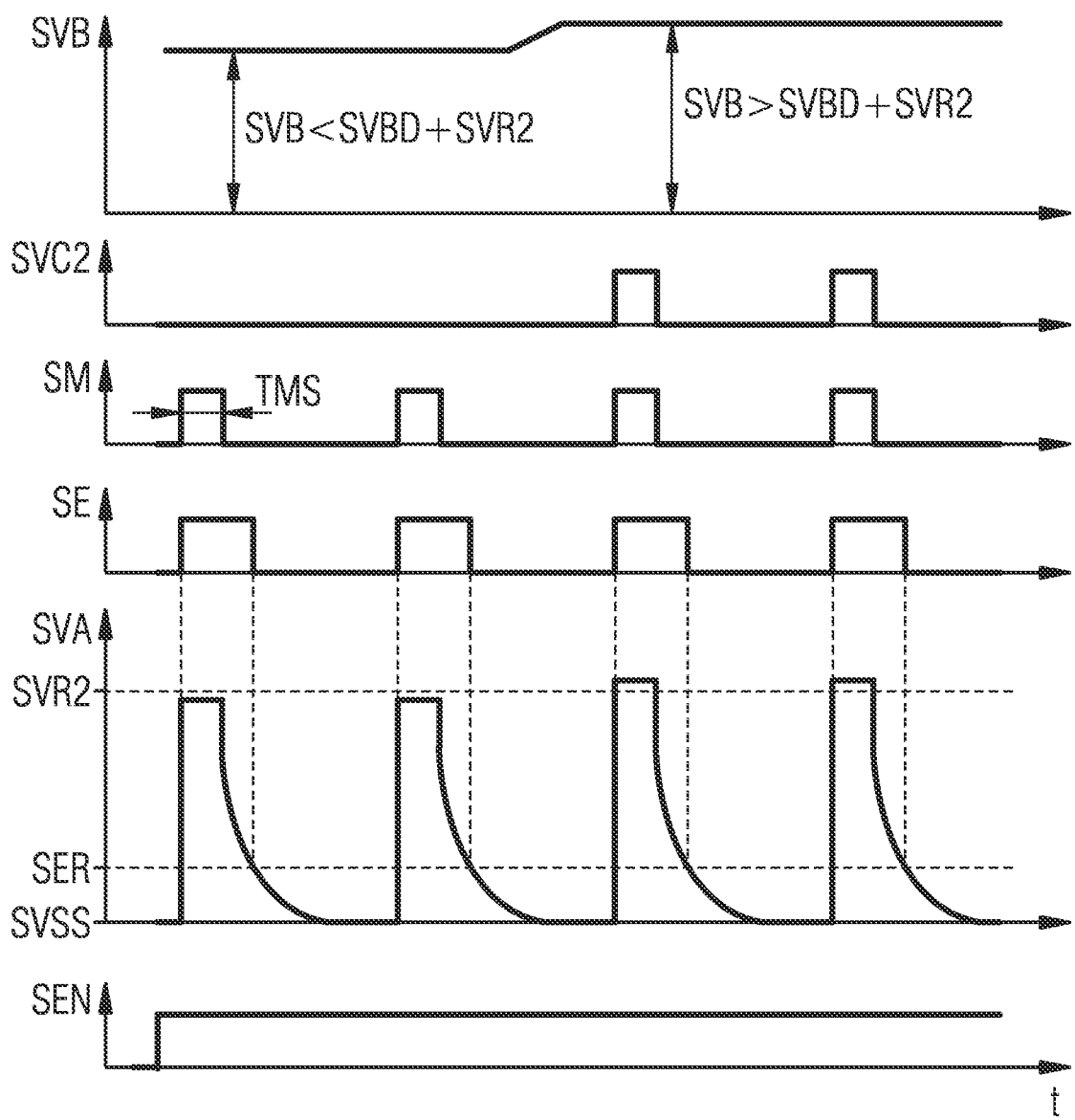
Figure 1E:
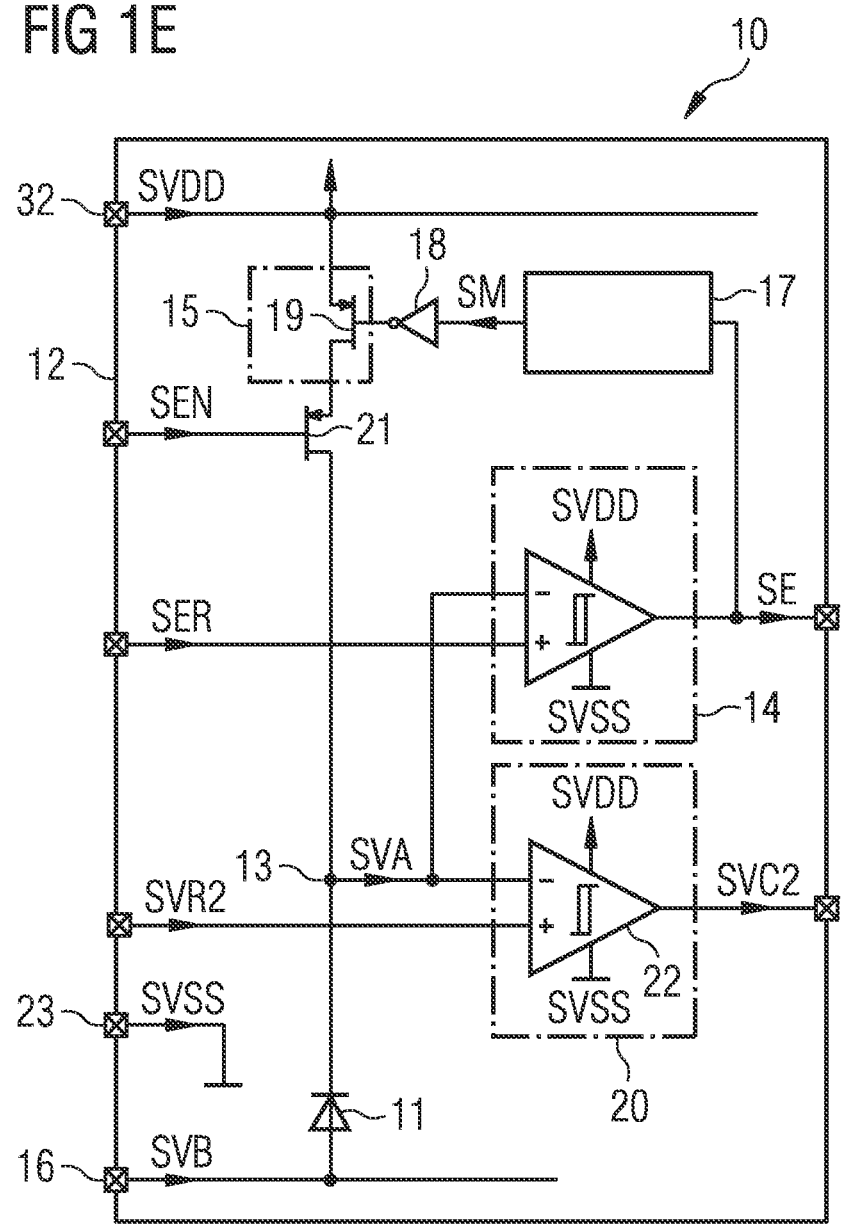

FIG. 1D shows an exemplary embodiment of signals of the avalanche diode arrangement 10 shown in FIGS. 1A to 1C. The avalanche diode arrangement 10, respectively the reference pixel 12, is enabled at the start by the enabling signal SEN. When no photon is absorbed by the avalanche diode 11, the avalanche diode 11 does not conduct any current except of the DCR. During this time the enabling transistor 21 and the quenching circuit 15 are in a conducting state, thus the node voltage SVA has approximately the value of the reference potential SVSS. When a photon is absorbed by the avalanche diode 11 or an avalanche is triggered by the DCR, an avalanche breakdown occurs, the avalanche diode 11 obtains a high conductivity and thus the node voltage SVA rises.

The node voltage SVA rises above the event threshold SER. The event detector 14 detects such a rise of the node voltage SVA that is a triggering event and provides the event signal SE that immediately results in a change of the control signal SM. At the triggering event, the control signal SM sets the quenching circuit 15 into a non-conductive state and the quenching of the avalanche in the avalanche diode 11 occurs. Further electron and holes are still generated in the space charge region of the avalanche diode 11, but cannot trigger an avalanche breakdown. The control signal SM sets the quenching circuit 15 in the non-conductive state during a quenching duration TMS which is determined by the monostable multivibrator 17. The quenching transistor 19 is non-conductive during the quenching duration TMS and is conductive in other times.

During the quenching duration TMS, the detection circuit 20 compares the node voltage SVA with the reference voltage SVR2. During the quenching duration TMS, the node voltage SVA is equal to an excess bias voltage SVE. As shown in FIG. 1D, the node voltage SVA is smaller than the reference voltage SVR2 during the first and the second trigger event. The detection signal SVC2 has the value 0. In this case, the value of the bias voltage SVB follows the following equation:

$$SVB < SVBD + SVR2,$$

wherein SVBD is the value of the breakdown voltage and SVR2 is the value of the reference voltage.

The control circuit 42 generates the generator control signal SGC with a value such that the bias voltage SVB is increased after the second triggering event. Thus, as shown in FIG. 1D in the third and the fourth trigger event, the node voltage SVA is higher than the reference voltage SVR2. At the third and the fourth trigger event, the detection signal SVC2 is generated having the logical value 1. In this case, the bias voltage SVB follows the following equation:

$$SVB > SVBD + SVR2$$

Thus, the bias voltage SVB is controlled by signals provided by the reference pixel 12, mainly by the signals generated by the detection circuit 20 such as the detection signal SVC2.

In FIG. 1D, the timing diagram of the signals of the reference pixel 12 are shown. The reference voltage SVR2 may be equal to a predetermined value of the excess bias voltage SVE. With the first two trigger events, the reference voltage SVR2 is not reached by the node voltage SVA, since the bias voltage SVB is still too low. Afterwards, the bias voltage SVB is increased causing the node voltage SVA to cross the reference voltage SVR2.

The avalanche diode 11 may be configured as a single photon avalanche diode, abbreviated to SPAD. The avalanche diode 11 is operated several volts (typically with the excess bias voltage SVE=3 V) above their breakdown voltage SVBD (typically the breakdown voltage SVBD=30 V). Therefore, the applied bias voltage SVB is:

$$SVB=SVBD+SVE$$

Typically SVB=33 V. Advantageously, the avalanche diode arrangement 10 keeps the excess bias voltage SVE constant. This ensures that the sensitivity of the avalanche diode 11 remains constant as well. The breakdown voltage SVDB varies a lot over manufacturing conditions and temperature. Since the excess bias voltage SVE fixed at the predetermined value is applied by controlling the bias voltage SVB, sensitivity is kept constant and damaging of subsequent quenching and detecting circuits is avoided.

The avalanche diode arrangement 10 provides a reference for the bias voltage generator 43 that relies on the breakdown voltage SVBD respectively the excess bias voltage SVE of the avalanche diode 11 itself. This is achieved by monitoring the voltage swing at the anode of the avalanche diode (low voltage domain) that is the node voltage SVA which corresponds directly to the excess bias voltage SVE. The output of the reference pixel 12 is a first digital signal, the event signal SE, which signifies the avalanche diode activity and a second digital signal, the detection signal SVC2, depending on whether the excess bias voltage SVE is below or above the predetermined value of the excess bias voltage SVE. This information is fed into a digital or analog filter 40 for controlling the bias voltage generator 43.

Thus, the bias voltage SVB is regulated based on the direct comparison of the excess bias voltage SVE against a desired value. The accuracy of the measurement of the excess bias voltage SVE is only limited by the accuracy of the comparator 22. The direct measurement of the excess bias voltage SVE allows an accurate regulation of the bias voltage SVB resulting in a stable operation over temperature and process variation.

The reference pixel 12 is provided with two predetermined values for the event threshold SER and the reference voltage SVR2 or optionally with two variable values provided by the DAC 41. The DAC 41 is controlled by the control unit 42. Inside the reference pixel 12 shown in FIG. 1B, the node voltage SVA is compared at least against the event threshold SER (e.g. 1 V) and the reference voltage SVR2 (e.g. 3 V). The node voltage SVA is pulled down to the reference potential SVSS by the quenching transistor 19, if no avalanche triggering occurs. The impedance of the quenching transistor 19 depends on the applied gate voltage. As soon as the selected avalanche diode 11 is triggered, its impedance becomes very low pulling up the node voltage SVA towards the bias voltage SVB. If the node voltage SVA is pulled up above the event threshold SER, the quenching transistor 19 is switched off by the monostable multivibrator 17 during the predefined quenching duration TMS, the so-called dead time. As soon as the voltage across the avalanche diode 11 becomes smaller than its breakdown voltage SVB, the avalanche effect turns off (so-called quenching). Since the quenching transistor 19 is switched off, the node voltage SVA will remain at the same level for the defined dead time TMS.

After the quenching duration TMS, the node voltage SVA is pulled back to the reference potential SVSS by the quenching transistor 19. The peak voltage of the node voltage SVA respectively the voltage swing at the first node 13 corresponds to the excess bias voltage SVE, the amount of bias voltage SVB above the breakdown voltage SVBD of the avalanche diode 11. The event signal SE at the output of the comparator 14 provides the information whether the selected avalanche diode 11 has triggered or not and activates the monostable multivibrator 17 in order to switch off the quenching transistor 19. The detection signal SVC2 at the output of the Schmitt-trigger circuit 22 or comparator provides the information whether the excess bias voltage SVE is below or above the predetermined value during the quenching duration TMS. Thus, every time the avalanche diode 11 triggers the information about the trigger event and if the actual excess bias voltage SVE is below or above the defined level is provided. The detection circuit 20 operates as a single bit quantizer.

The latter information can be processed in the digital or analog filter 40. The digital filter 40 can be implemented e.g. as a moving average filter which calculates the ratio between the "ones" and "zeros" provided by the detection signal SVC2 at the positive edges of the event signal SE. If for instance the number of "ones" and "zeros" is equal, the excess bias voltage SVE has reached the predetermined value. The ratio signal SRA is provided to the control unit 42 which performs the corresponding action by increasing or decreasing the bias voltage SVB outputted by the bias voltage generator 43 by a given voltage step.

Alternatively, the detection circuit 20 comprises additional comparators and reference voltages. Thus, a multibit information can be retrieved for every triggering event. Depending on the wished accuracy, the detection circuit 20 can be implemented as a flash ADC by adding the appropriate number of comparators. The additional capacitive load 25 provided by additional comparators does not affect the voltage level measurement.

Alternatively, the detection circuit 20 may comprise exactly one Schmitt-trigger circuit 22 or comparator. The Schmitt-trigger circuit 22 or comparator is used for a one-bit quantification or for realization of a successive-approximation-register analog-to-digital converter, abbreviated SAR-ADC.

Alternatively, the detection circuit 20 may comprise more than one Schmitt-trigger circuit 22 or comparator. The at least two Schmitt-trigger circuits 22, 31 build a flash ADC or a multibit SAR-ADC.

The bias voltage generator 43 can be implemented as a charge pump or a continuous-time boost converter. Both implementations may be digitally controlled to cope with the digital filter 40. The charge pump can be controlled by a DAC providing the reference voltage for the pumping stages. For the continuous-time boost converter, the duty cycle of the charging switch can be adapted.

The moment when the selected avalanche diode 11 triggers is either triggered by the inherently given dark count rate, abbreviated as DCR, which means that the avalanche diode 11 triggers spontaneously without exposing the reference pixel 12 to any photons, or by exposing the reference pixel 12 to photons. For the latter option, a small portion of the light pulse used for the normal application could be reflected directly to the reference pixel 12. As further illustrated in FIGS. 4C and 4E, the photon emission can also be realized by placing at least a dedicated pn-junction around the reference pixel 12 that will be forward biased in order to emit photons by electron-hole recombination (injection electroluminescence). If the reference pixel 12 is exposed to photons at a known time instead of using the monostable multivibrator 17, the quenching could be disabled by the enable signal SEN shortly before the photons are expected. This eliminates the need of a monostable multivibrator 17 and reduces the speed requirements of the event detector 14.

If the reference pixel 12 is triggered only by the DCR, the update rate of the reference pixel 12 may vary, since the DCR is dependent on the temperature. There are several possibilities to stabilize the DCR:

The number of active avalanche diodes 11, 26, 27 inside the reference pixel 12 can be increased at lower temperatures or decreased at higher temperatures by the switch control signal SEL.

The reference pixel 12 can be enabled at higher temperatures only when an update is requested from the control unit 42.

Increasing the capacitance value of the load capacitor 25 at the first node 13 increases the after pulsing probability. By increasing the capacitance value of the load capacitor 25 at lower temperatures or decreasing it at higher temperatures, the DCR can be stabilized further.

A trigger event can be suppressed by the enabling signal SEN. Thus, the rate of avalanche breakdowns may be lower than the DCR.

The above-mentioned procedures related to the temperature do not require the monitoring of the temperature itself. The controlling of the mentioned mechanisms to stabilize the DCR can be done by the filter 40 or the control unit 42 by measuring the DCR.

Some applications may require the adaptive controlling of the sensitivity of the avalanche diode 11 depending on the light conditions of the background or the wanted event signal SE. For this purpose, the event threshold SER and the reference voltage SVR2 can be varied in order to have control over the excess bias voltage SVE that has a direct impact on the sensitivity, DCR and after pulsing probability of the avalanche diode 11.

The reference pixel 12 allows including an almost unlimited number of selectable avalanche diodes 11, 26, 27 as the resulting timing variation due to the additional load capacitor 25 does not affect the voltage level measurement. Having more than one avalanche diode 11, 26, 27 per reference pixel 12 enables the ability to mask out defective avalanche diodes 11, 26, 27 like screamers and to build a statistic out of several avalanche diodes 11, 26, 27 to optimize the bias voltage SVB depending on the distribution of the breakdown voltages SVBD of the different avalanche diodes 11. The avalanche diodes 11, 26, 27 could be selected sequentially generating an average value in the filter 40. This reduces mismatch error of the breakdown voltage SVBD among the reference avalanche diodes 11, 26, 27.

In general, for the reference pixel 12 the additional load capacitor 25 does not affect the voltage level measurement, as the measurement is not depending on the rising/falling time of the node voltage SVA. Since the voltage level measurement has no timing requirements, the capacitance value of the load capacitor 25 can be increased to relax the timing requirements of the event detector 14 and the detection circuit 20. For the comparator of the event detector 14 an additional capacitance value of the load capacitor 25 slows down the rising time of the node voltage SVA allowing more comparator delay. For the comparator 22 of the detection circuit 20, an additional capacitance value of the load capacitor 25 stabilizes the node voltage SVA allowing a longer dead-time TMS and reducing the speed requirements.

FIG. 1D shows an exemplary embodiment of the avalanche diode arrangement 10 that is a further development of the embodiments shown in FIGS. 1A to 1C. Wherein in the avalanche diode arrangement 10 illustrated in FIGS. 1A and 1B, the bias voltage SVB has a positive value, the bias voltage SVB in the avalanche diode arrangement 10, shown in FIG. 1D, has a negative value with respect to the reference potential SVSS. For example, the value of the bias voltage SVB is −30 V. Additionally, the reference pixel 12 and, thus, the avalanche diode arrangement 10 comprises a supply voltage terminal 32. A supply voltage SVDD is provided at the supply voltage terminal 32. The supply voltage SVDD has a positive value with respect to the reference potential SVSS. For example, the supply voltage SVDD has the value 3.3 V. Thus, the reference pixel 12 comprises three supply terminals, namely the first voltage terminal 16 for providing the bias voltage SVB, the second voltage terminal 23 at which the reference potential SVSS can be tapped and the supply voltage terminal 32.

A series circuit of the avalanche diode 11, the enabling transistor 21 and the quenching circuit 15 is arranged between the first voltage terminal 16 and the supply voltage terminal 32. The avalanche diode 11 is connected to the first voltage terminal 16. Here the first terminal of the avalanche diode 11 is connected to the first voltage terminal 16. The first node 13 is connected to the second terminal of the avalanche diode 11. The quenching circuit 15 is connected to the supply voltage terminal 32. The second terminal of the quenching transistor 19 is coupled to the supply voltage terminal 32. The first node 13 is located between the enabling transistor 21 and the avalanche diode 11 as also illustrated in FIGS. 1A and 1B.

The circuits of the reference pixel 12 and, thus, of the avalanche diode arrangement 10 such as for example the event detector 14 and/or the Schmitt-trigger circuit 22 of the detection circuit 20 and/or the monostable multivibrator 17 and/or the inverter 18 have supply terminals that are connected to the supply voltage terminal 32 and to the second voltage terminal 23. Thus, the event detector 14 and/or the detection circuit 20 and/or the monostable multivibrator 17 and/or the inverter 18 are supplied by the supply voltage SVDD and the reference potential SVSS. The enabling signal SEN may have a value between 0 and 3.3 V. The event threshold SER may have a value of 2.7 V for example. The reference voltage SVR2 may have a value of 0.5 V. The reference potential SVSS may obtain the value 0 V.

In case the avalanche diode 11 is not triggered, the node voltage SVA is approximately equal to the supply voltage SVDD. In case the avalanche diode 11 is triggered, the node voltage SVA quickly decreases. The decrease of the node voltage SVA results in a pulse of the event signal SE.

The quenching transistor 19 may be implemented as a p-channel metal-oxide-semiconductor field-effect transistor.

The avalanche diode arrangement 10 and, thus, the reference pixel 12 may comprise the further circuit parts shown in FIG. 1B such as the further Schmitt-trigger circuit 31, the second and the third avalanche diode 26, 27, the first to the third diode switch 28 to 30 and the load capacitor 25.

Figure 2:
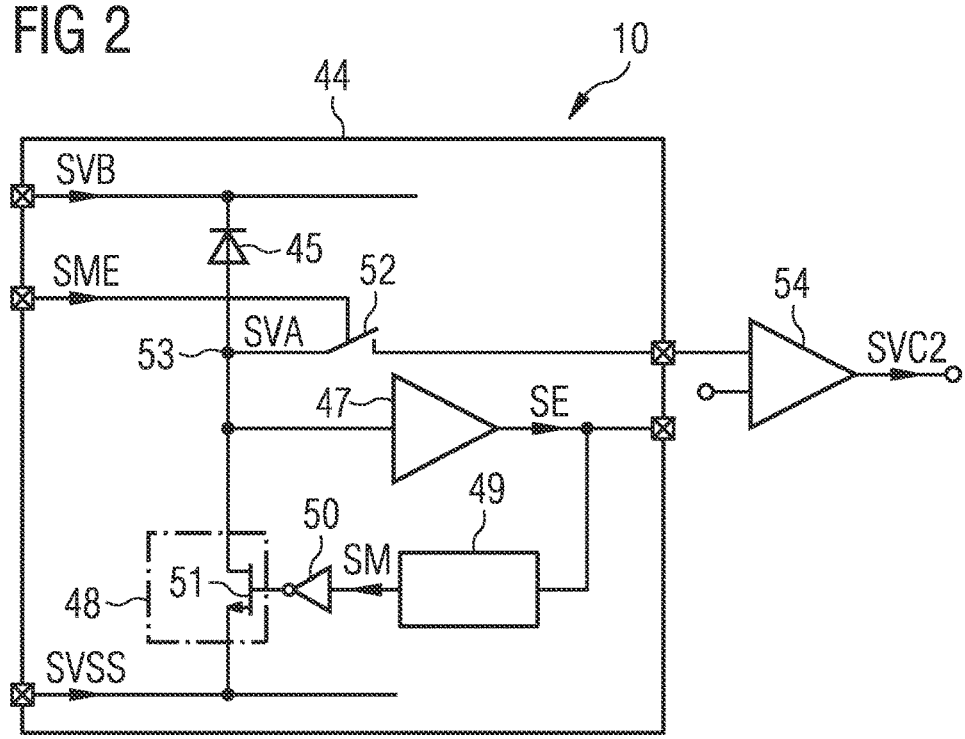
FIGS. 2 and 3 show further exemplary embodiments of an avalanche diode arrangement.

FIG. 2 shows a further exemplary embodiment of the avalanche diode arrangement 10 that is a further development of the above-described embodiments. The avalanche diode arrangement 10 comprises the active pixel 44. The active pixel 44 comprises the further avalanche diode 45, a further event detector 47 and a further quenching circuit 48.

The further event detector 47 is coupled on its output side to a control terminal of the further quenching circuit 48. The active pixel 44 comprises a further monostable multivibrator 49 arranged between an output of the further event detector 47 and the control input of the further quenching circuit 48. A further inverter 50 couples an output of the further monostable multivibrator 49 to the control terminal of the further quenching circuit 48. The further quenching circuit 48 comprises a further quenching transistor 51.

The further event detector 47 is realized as a buffer. Alternatively, the further event detector 47 may be implemented as comparator, Schmitt-trigger circuit, operational amplifier or inverter. Moreover, the active pixel 44 comprises a measurement switch 52. A first terminal of the measurement switch 52 is connected to a further first node terminal 53. The further avalanche diode 45 is connected via the further first node 53 to the quenching circuit 48. A second terminal of the measurement switch 52 is coupled via an output of the active pixel 44 to a further detection circuit 54. The further detection circuit 54 may be realized such as the detection circuit 20 shown in FIGS. 1A and 1B or described above. The measurement switch 52 is controlled by a measurement signal SME.

Thus, the further avalanche diode 45 comprised by the active pixel 44 can be used for the feedback for providing an appropriate bias voltage SVB. The further avalanche diode 45 can be realized as a single photon avalanche diode, abbreviated SPAD. The further avalanche diode 45 can be named as an application specific single photon avalanche diode. The active pixel 44 can be used as a reference element by using the measurement switch 52.

The active pixel 44 can be designed as an application related SPAD pixel. The active pixel 44 is used to measure the excess bias voltage SVE, instead of the reference pixel 12, by adding the measurement switch 52 that connects the anode of the further avalanche diode 45 to a wire providing the node voltage SVA that is an anode voltage to a central reference pixel. This allows to regulate the bias voltage SVB according to the active pixel 44 itself provided that the anode of the further avalanche diode 45 does not suffer from the additional capacitive load provided by the measurement switch 52. The active pixel 44 has a further built-in monostable multivibrator 49 like the reference pixel 12. This requirement is only valid, if the triggering of the further avalanche diode 45 cannot be done intentionally by injecting photons at a particular time.

The avalanche diode arrangement 10 may be free of a reference pixel 12, since the active pixel 44 is used for regulation of the bias voltage SVB. The active pixel 44 and the further detection circuit 54 could be inserted into the avalanche diode arrangement 10 shown in FIG. 1C instead of the reference pixel 12.

Figure 3:
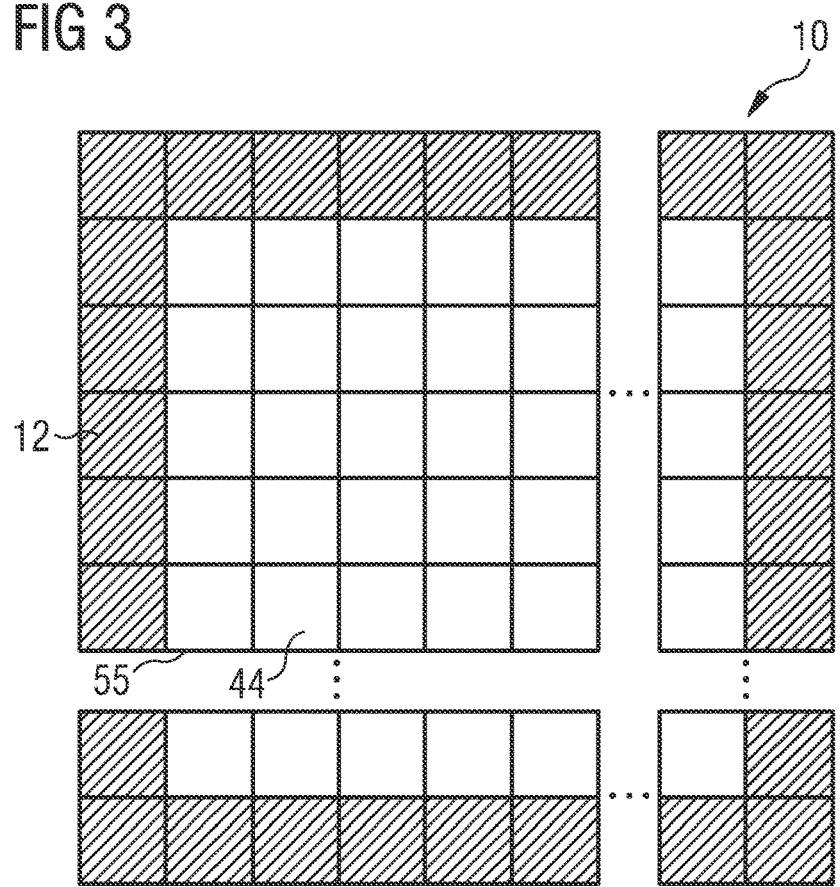

FIG. 3 shows a top view of an exemplary embodiment of the avalanche diode arrangement 10 that is a further development of the above-described embodiments. The avalanche diode arrangement 10 comprises an array 55 of active pixels 44. An example of such an active pixel 44 is shown in FIG. 2. The array 55 comprises more than one line and more than one column of active pixels 44. The array 55 may comprise for example six columns and six lines of active pixels 44.

The avalanche diode arrangement 10 comprises more than one reference pixel 12. The array 55 of active pixels 44 is surrounded by reference pixels 12. The reference pixels 12 may be realized such as shown in FIG. 1A or 1B. The reference pixels 12 encircle the array 55 of active pixels 44. Thus, in the example shown in FIG. 3, 28 reference pixels 12 encircle the array 55 of active pixels 44.

This method allows the controlling of the excess bias voltage SVE without interrupting the normal operation. The avalanche diodes 11 of the reference pixels 12 are placed e.g. as dummy ring around the further avalanche diodes 45 of the active pixels 44. Thus, also gradients of the breakdown voltage SVBD on the semiconductor body can be detected.

Figure 4A:
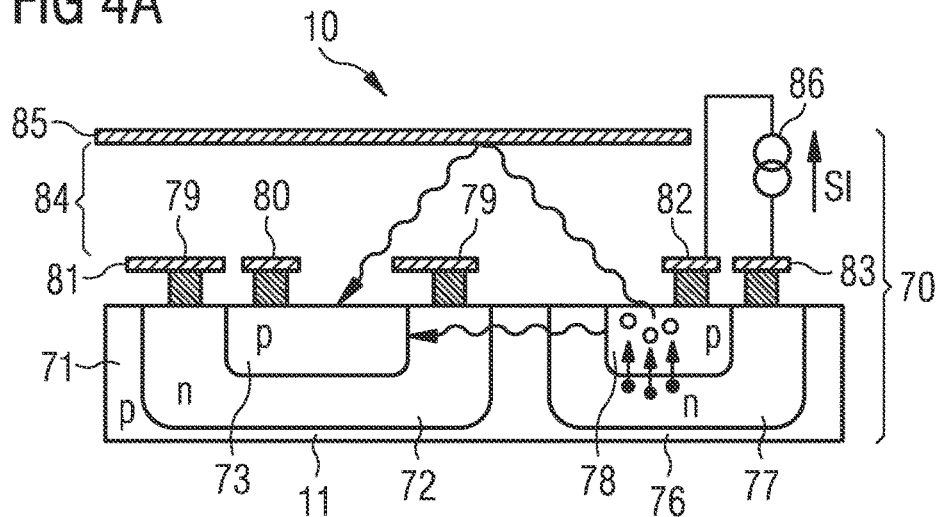

FIG. 4A shows an exemplary embodiment of an avalanche diode arrangement 10. The avalanche diode arrangement 10 may be used for one of the embodiments shown in the above-described figures. Alternatively, the avalanche diode arrangement 10 shown in FIG. 4A may be implemented without the circuits shown in FIGS. 1A to 1E, 2 and 3. The avalanche diode arrangement 10 is realized by a semiconductor body 70. The semiconductor body 70 comprises a substrate 71. Inside the substrate 71, a well 72 is realized. The substrate 71 has a first conductivity type. The well 72 has a second conductivity type. The second conductivity type is opposite to the first conductivity type. Thus, the substrate 71 and the well 72 obtain opposite conductivity types. Inside of the well 72, a region 73 having the first conductivity type is realized. The region 73 can be implemented as a shallow well. The region 73 has a circular or rectangular form with or without rounded edges. Thus, the semiconductor body 70 comprises the avalanche diode 11. The avalanche diode 11 comprises the well 72 and the region 73. The first conductivity type may be the p-conductivity type and the second conductivity type may be the n-conductivity type. The region 73 may form an anode and the well 72 may form a cathode of the avalanche diode 11.

Moreover, the semiconductor body 70 comprises a diode 76. The diode 76 comprises an additional well 77 and an additional region 78 inside the additional well 77. The diode 76 may be a standard diode and not an avalanche diode. The additional well 77 obtains the second conductivity type and the additional region 78 obtains the first conductivity type.

The region 73 and the well 72 are contacted by connection lines 79, 80. The additional well 77 and the additional region 78 of the diode 76 are also contacted by connection lines 82, 83. The connection lines 79, 80, 82, 83 are comprised by a first metallization layer 81. The semiconductor body 70 comprises an isolation layer 84. The isolation layer 84 may be an oxide such as silicon dioxide or a metal oxide. On top of the isolation layer 84, a second metallization layer 85 of the semiconductor body 70 is deposited. The second metallization layer 85 at least partially covers the avalanche diode 11 and the diode 76.

The avalanche diode arrangement 10 comprises a current source 86 that is coupled to the diode 76 via the connection lines 82, 83. An output of the control unit 42 may be coupled to the current source 86. A current SI flowing through the diode 76 generates electrons and holes. The current SI may be a function of the photon control signal SP shown in FIG. 1C. The combination of electrons and holes generates photons; the photons are absorbed by the avalanche diode 11. The photons are propagating from the diode 76 to the avalanche diode 11 through semiconductor regions or through the isolation layer 84 and are mirrored at the second metallization layer 85. The distance of the avalanche diode 11 to the diode 76 is short such that the diode 76 is able to generate photons that trigger an avalanche effect in the avalanche diode 11. The photons are generated with a forward biased diode 76 by electroluminescence. The diode 76 is realized as a pn-junction adjacent to the avalanche diode 11.

In an alternative, not shown embodiment, the first conductivity type is the n-conductivity type and the second conductivity type is the p-conductivity type. Thus, the region 73 forms the cathode of the avalanche diode 11. The well 72 forms the anode of the avalanche diode 11.

Alternatively, the additional well 77 obtains the first conductivity type and the additional region 78 obtains the second conductivity type.

Figure 4B:
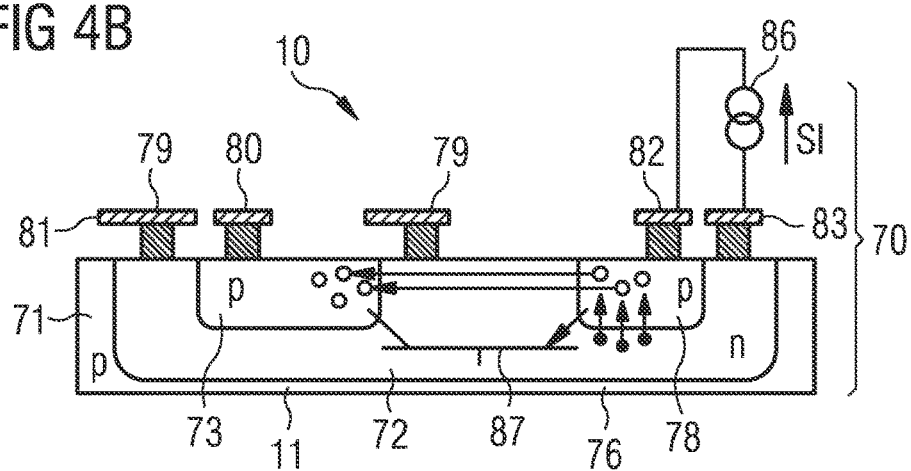

FIG. 4B shows a further exemplary embodiment of the avalanche diode arrangement 10 which is a further development of the embodiment shown in FIG. 4A. The diode 76 is integrated with the avalanche diode 11. Thus, the additional region 78 is fabricated inside the well 72. The additional well 77 is omitted. The additional region 78, the well 72 and the region 73 form a bipolar transistor 87. The bipolar transistor 87 may be implemented as a parasitic bipolar transistor. The bipolar transistor 87 provides charge carriers from the diode 76 to the avalanche diode 11. Thus, charge carriers flow from the diode 76 into the space charge region of the avalanche diode 11 causing an avalanche breakdown in the avalanche diode 11. An injection of holes into the avalanche diode 11 is performed through the bipolar transistor 87. The bipolar transistor 87 is designed as a lateral transistor. The bipolar transistor 87 is realized as a pnp-transistor. In an alternative embodiment, the bipolar transistor 87 is implemented as an npn-transistor.

Figure 4C:
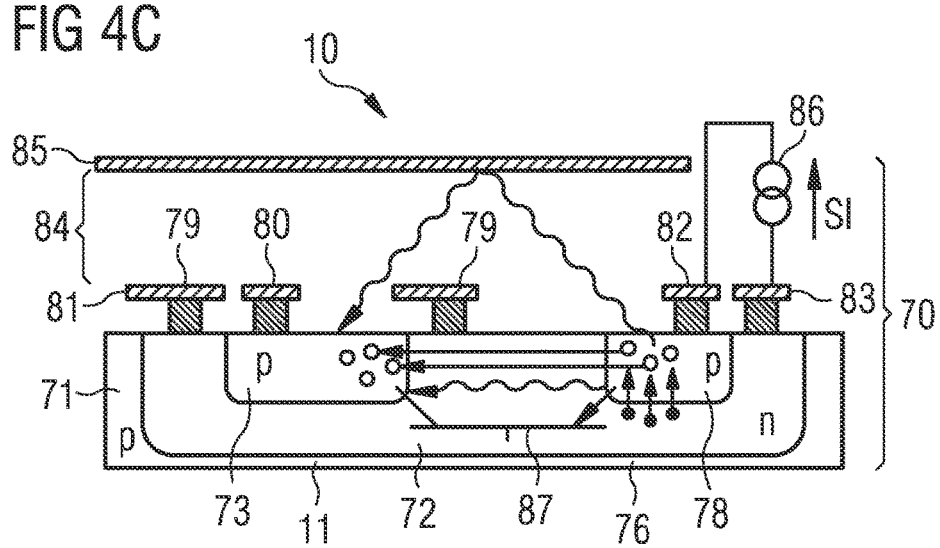

FIG. 4C shows a further exemplary embodiment of an avalanche diode arrangement 10 which is a further development of the embodiments shown in the above-described figures. As shown in FIG. 4C, the diode 77 generates photons which can trigger the avalanche breakdown of the avalanche diode 11. Moreover, the diode 77 generates charge carriers which flow to the avalanche diode 11 for generating an avalanche breakdown inside the avalanche diode 11.

In the avalanche diode arrangement 10, photons are generated with a forward bias adjacent pn-junction 76 by electroluminescence and holes are injected through the bipolar transistor 87. The charge carriers flowing through the bipolar transistor 87 and the photons produce an avalanche effect in the avalanche diode 11. The bipolar transistor 87 has an effect only at the point of time when it is conducting and has no effect afterwards. The bipolar transistor 87 does not change the characteristic of the avalanche diode 11 itself.

FIG. 4D shows a further exemplary embodiment of the avalanche diode arrangement 10 that is a further development of the embodiments shown in the above-described figures. The avalanche diode 11 comprises the well 72 and the region 73. The well 72 obtains the second conductivity type and the region 73 obtains the first conductivity type. Contrary to the avalanche diode 11 shown in FIGS. 4A to 4C, the first conductivity type is the n-conductivity type and the second conductivity type is the p-conductivity type. The diode 76 comprises the well 72 and the additional region 78. The photon emission unit 46 comprises the current source 86 and the diode 76. Here the additional region 78 obtains the first conductivity type. The bipolar transistor 87 is realized as an npn-transistor. The well 72 is arranged in the substrate 71. The substrate 71 may be doped according to the second conductivity type. Thus, the substrate 71 and the well 72 obtain the same conductivity type. The substrate 71 may be p-doped. The doping concentration of the well 72 is higher than the doping concentration of the substrate 71.

The avalanche diode 11 can be triggered by photons generated by the diode 76. Alternatively or additionally, the avalanche diode 11 can be triggered by a charge carrier flow through the bipolar transistor 87.

In an alternative, not shown embodiment, the substrate 71 has the first conductivity type. For example, the substrate 71 may be n-doped.

The invention claimed is:

1. An avalanche diode arrangement, comprising:
   an avalanche diode that is coupled to a first voltage terminal and to a first node,
   an event detector for detecting a trigger event of the avalanche diode and being coupled to the first node,
   a quenching circuit that is coupled to the first node, and
   a detection circuit coupled to the first node, wherein the detection circuit is configured to provide a detection signal that depends on a value of a node voltage at the first node, and wherein the avalanche diode arrangement is configured to control a value of a bias voltage at the first voltage terminal depending on the detection signal.

2. The avalanche diode arrangement according to claim 1, wherein the quenching circuit comprises a quenching transistor having
   a first terminal coupled to the first node,
   a second terminal and
   a control terminal coupled to an output of the event detector.

3. The avalanche diode arrangement according to claim 1, wherein the event detector comprises a first input coupled to the first node and is configured to generate an event signal depending on a comparison of a signal at its first input with an event threshold.

4. The avalanche diode arrangement according to claim 1, wherein the event detector is implemented as one circuit of a group comprising a comparator, a Schmitt-trigger circuit, an operational amplifier, a buffer and an inverter.

5. The avalanche diode arrangement according to claim 1, comprising a monostable multivibrator that is arranged between an output of the event detector and a control terminal of the quenching circuit.

6. Avalanche diode arrangement according to claim 1, wherein the detection circuit is configured to provide the detection signal as a function of the value of the node voltage during a quenching duration in which the avalanche diode is quenched.

7. The avalanche diode arrangement according to claim 1, wherein the detection circuit is implemented as an analog-to-digital converter for digitizing the value of the node voltage.

8. The avalanche diode arrangement according to claim 1, wherein the detection circuit comprises one circuit of a group comprising a comparator and a Schmitt-trigger circuit having
   a first input coupled to the first node and
   a second input to which a reference voltage is provided.

9. The avalanche diode arrangement according to claim 8, comprising a digital-to-analog converter with an output coupled to the second input of the detection circuit.

10. The avalanche diode arrangement according to claim 1, comprising a diode, wherein the avalanche diode and the diode are located in a semiconductor body such that the diode is operable to trigger the avalanche diode.

11. A method for providing a detection signal, comprising:
    generating an event signal by an event detector that detects a trigger event of an avalanche diode,
    quenching the avalanche diode by a quenching circuit that is coupled via a first node to a first terminal of the avalanche diode,
    providing a detection signal by a detection circuit that depends on a value of a node voltage at the first node, and controlling a value of a bias voltage at the first voltage terminal by the detection signal, wherein a second terminal of the avalanche diode is coupled to the first voltage terminal.

12. An avalanche diode arrangement, comprising:
an avalanche diode that is coupled to a first voltage terminal and to a first node,
an event detector for detecting a trigger event of the avalanche diode and being coupled to the first node,
a quenching circuit that is coupled to the first node,
a detection circuit coupled to the first node, wherein the detection circuit is configured to provide a detection signal that depends on a value of a node voltage at the first node, and
a diode, wherein the avalanche diode and the diode are located in a semiconductor body such that the diode is operable to trigger the avalanche diode.

* * * * *